United States Patent [19]

Masterson

[11] Patent Number: 4,970,418
[45] Date of Patent: Nov. 13, 1990

[54] PROGRAMMABLE MEMORY STATE MACHINE FOR PROVIDING VARIABLE CLOCKING TO A MULTIMODE MEMORY

[75] Inventor: Anthony D. Masterson, Cupertino, Calif.

[73] Assignee: Apple Computer, Inc., Cupertino, Calif.

[21] Appl. No.: 412,858

[22] Filed: Sep. 26, 1989

[51] Int. Cl.⁵ .......................................... H03K 3/017
[52] U.S. Cl. .................................. 307/480; 307/265;
  307/269; 328/58; 364/200; 365/233; 365/238.5
[58] Field of Search ............... 307/443, 465, 480–481,
  307/265, 269; 328/58, 63; 364/270.2, 950.4;
  365/233, 238.5

[56] References Cited

U.S. PATENT DOCUMENTS

| | | | |
|---|---|---|---|
| 4,241,418 | 12/1980 | Stanley | 307/480 X |
| 4,494,021 | 1/1985 | Bell et al. | 307/481 X |
| 4,499,536 | 2/1985 | Gemma et al. | 364/200 |
| 4,581,722 | 4/1986 | Takemae | 365/233 x |
| 4,611,279 | 9/1986 | Andresen et al. | 364/200 |
| 4,675,546 | 6/1987 | Shaw | 328/58 X |
| 4,692,633 | 9/1987 | Ngai et al. | 307/480 X |
| 4,833,650 | 5/1989 | Hirayama et al. | 365/238.5 X |
| 4,843,263 | 6/1989 | Ando | 307/480 |
| 4,857,760 | 8/1989 | Stuebing | 307/265 X |
| 4,870,665 | 9/1989 | Vaughn | 307/265 X |

*Primary Examiner*—David Hudspeth
*Attorney, Agent, or Firm*—Blakely, Sokoloff, Taylor & Zafman

[57] ABSTRACT

A circuit for providing control signals of selectable lengths capable of being driven off of either the rising or falling edge of a clock pulse, the circuit comprising apparatus for providing signals indicating a mode of operation for access to a matrix of memory elements, apparatus responsive to the signals provided by the apparatus for providing signals indicating a mode of operation for providing signals indicating a clock period during which a control signal is to commence and the edge of the clock signal at which such signal is to commence, and apparatus responsive to the signals provided by the apparatus for providing signals indicating a mode of operation for providing signals indicating a clock period during which a control signal is to terminate and the edge of the clock signal at which such signal is to terminate.

12 Claims, 4 Drawing Sheets

PROGRAMMABLE MEMORY STATE MACHINE FOR PROVIDING VARIABLE CLOCKING TO A MULTIMODE MEMORY

BACKGROUND OF THE INVENTION

1. Field of the Invention

This invention relates to computer memory systems, and, more particularly, to arrangements for selectively varying the length of control signals used in a computer memory arrangement.

2. History of the Prior Art

In a conventional computer memory system utilizing dynamic random access memory (DRAM) elements, any particular memory position is accessed by providing a row address and a column address with corresponding row address strobe and column address strobe signals each occurring at a particular time and having a particular length sufficient to select the memory position for the particular mode of operation and for the particular type of memory element being used.

Any particular memory system may be constructed of DRAM elements (or VRAM elements) all capable of switching at a particular switching speed such as 150 nanoseconds, 120 nanoseconds, or 80 nanoseconds. In the memory system any particular computer, it is desirable to be able to utilize DRAM elements having different switching times. To utilize DRAMs having different switching times in the same memory system, the control pulses such as the row address strobe and the column address strobe must therefore either be sufficiently long and occur at sufficient intervals that they may be utilized with the slowest switching DRAM elements expected to be used with the system or the system must be somehow capable of switching the times and intervals between such control pulses in some manner to match the particular switching elements to be used. If the control pulses and intervals therebetween are selected to be long enough to handle the slowest switching memory elements, then the system will run at a relatively slow speed even with memory elements capable of switching at much higher speeds. To obviate this problem, it is desirable to be able to reprogram the memory controller to take advantage of the faster access time if faster memory is inserted into the system.

Even a memory system capable of using only memory elements which operate at a single speed, may be made substantially faster if its control signals may be programmed to match the speeds of the particular modes of operation. For example, a read cycle and a write cycle may take entirely different times to accomplish. A read cycle and a page read cycle (one in which the same row address is used for adjacent memory positions so that a new page need not be addressed) should take different times to accomplish. However, unless the control signals may be varied to fit the length of the these particular modes of operation, the differences in speed available to the different modes will not in practice be carried through to the operation of the machine.

For these reasons, attempts have been made to provide programmable length control signals for effecting the operation of computer memory systems. Programmable length control signals have been realized to some extent, but the arrangements provided to date have been able to program such memory signals to select only between control signals which both begin and end on a single edge of a clock pulse (the rising edge). For this reason, the length of control pulses and the intervals therebetween have not been optimized both to match the switching times of the memory elements where those switching times may vary from unit to unit and to match the particular modes of operation being practiced by the machine.

SUMMARY OF THE INVENTION

It is, therefore, an object of the present invention to speed the operations of computer memory systems.

It is another object of the present invention to provide apparatus capable of being programmed to furnish variable length control signals which may commence and end on either the leading or trailing edge of the clock pulses driving the particular arrangement.

It is an additional object of the present invention to provide computer memory systems, the control signals for which may be programmed in length and in interval to match the memory elements used in the system and the mode of operation of the system.

This and other objects of the present invention are accomplished by a circuit for providing control signals of selectable lengths capable of being driven off of either the rising or falling edge of a clock pulse, the circuit comprising means for providing signals indicating a mode of operation for access to a matrix of memory elements, means responsive to the signals provided by the means for providing signals indicating a mode of operation for providing signals indicating a clock period during which a control signal is to commence and the edge of the clock signal at which such signal is to commence, and means responsive to the signals provided by the means for providing signals indicating a mode of operation for providing signals indicating a clock period during which a control signal is to terminate and the edge of the clock signal at which such signal is to terminate.

These and other objects and features of the invention will become apparent to those skilled in the art by reference to the following detailed description taken together with the drawings in which like elements are referred to by like designations throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

DETAILED DESCRIPTION OF THE INVENTION

Figure 1:
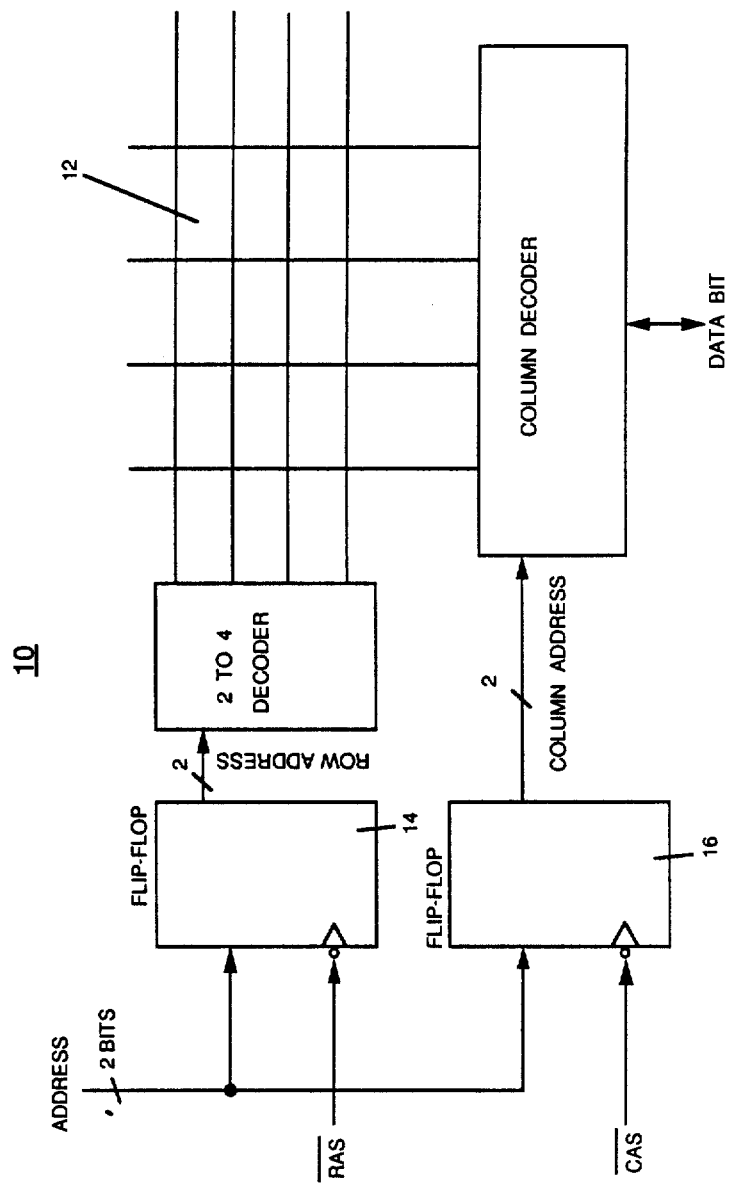
FIG. 1, illustrates in simplified form a typical addressing system for a computer DRAM memory.

Referring now to FIG. 1, there is shown in simplified form a typical addressing system 10 for a computer DRAM memory. The system 10 includes a memory arrangement 12 of four rows and four columns of memory elements arranged in matrix form. It should be assumed that the memory arrangement 12 includes a dynamic random access memory element at each intersection having connections made in a conventional manner. In order to select any particular memory element for access, a first row selection flip-flop 14 receives both a row address signal used to designate one of two particular rows with which it is associated and a row address strobe (RAS) pulse used to time the access. A second column selection flip-flop 16 receives a column address signal used to designate the selected column and a column address strobe (CAS) pulse used to time the access. The selection of the particular row and column addresses and the provision of the row address strobe signal and a column address strobe signal selects a particular memory element for access and the interval of the access.

Figure 2:
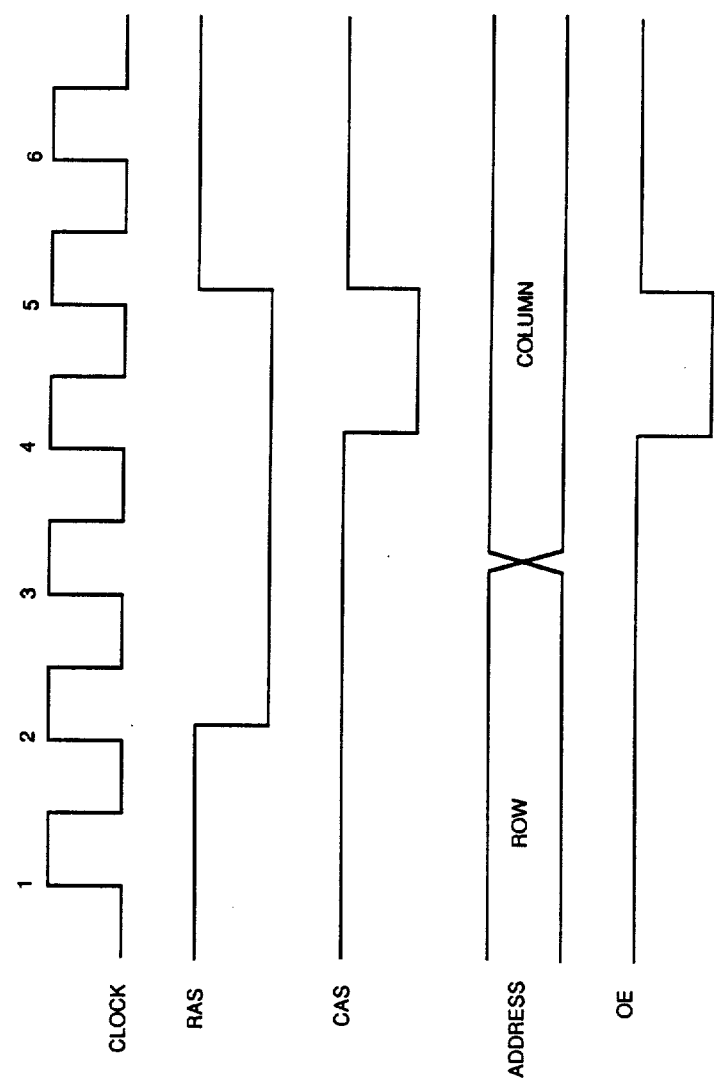
FIG. 2 illustrates the timing of the various signals provided in order to accomplish a particular access in prior art systems.

FIG. 2 illustrates the timing of the various signals provided in order to accomplish a particular access. In FIG. 2 a read operation is assumed. The system clock signal is shown in the top line of FIG. 2. This signal, as is known to those skilled in the art, is utilized for timing the various signals such as the row address strobe and the column address strobe. These two signals are shown in FIG. 2 immediately following the system clock signal. In FIG. 2, the row address strobe and the column address strobe signals vary between positive five volts and zero volt conditions and are considered to be asserted in the zero volt condition.

As may be seen in FIG. 2, the address signal used in selecting the particular row of interest, (in this case row four), is provided during an interval which has begun before the first clock pulse illustrated and continues until the leading edge of the third clock pulse. At this time, the column address signal is provided and continues for a time the length of which is not pertinent to the present description. While the row address signal is present at flip-flop 14, the row address strobe pulse is asserted at the flip-flop 14 on the rising edge of the second clock pulse thereby effecting the selection of the particular row of the matrix 12. At the rising edge of the third clock pulse, the column address signal is provided to the flip-flop 16 so that the flip-flop 16 is in condition to receive the column address strobe. The column address strobe occurs at the rising edge of clock pulse four and continues to the rising edge of clock five. This causes the selection of the particular memory element of the matrix 12 to be accomplished, and the output enable signal OE is furnished during the period between the rising edge of clock pulse four and and the rising edge of clock pulse five so that the memory element is read.

It may be seen from FIG. 2 that the particular implementation of the typical DRAM control signals requires three cycles from the rising edge of clock cycle two to the rising edge of clock cycle five in order to accomplish the particular read operation. In many cases, the switching elements of the DRAM matrix 12 may be able to operate in a shorter time span than the interval provided by such control signals so that shortening the lengths of those control signals would provide faster system operation. Moreover, it may also be that more precise intervals of operation are desirable for the different modes of operation in which the access of the memory matrix 12 may be desired. For example, the time taken for a read, a write, a page read, a page write, or other memory operation may, and probably will, differ in any particular memory control arrangement. A system will operate more efficiently if the access time for each mode may be varied to precisely fit the interval needed for such mode. Consequently, it is desirable to be able to provide a system which is capable of providing selectable length control signals such as row access strobe, column access strobe, output enable, write enable, and address multiplexor control which may be varied depending on the particular switching time of the memory element to be used and the mode of operation of the memory circuitry. This desirable feature is difficult to accomplish in a memory system in which the control signals occur only on the rising edge of the clock pulse because all control signals must be an integer multiple of a clock pulse in length.

Figure 3:
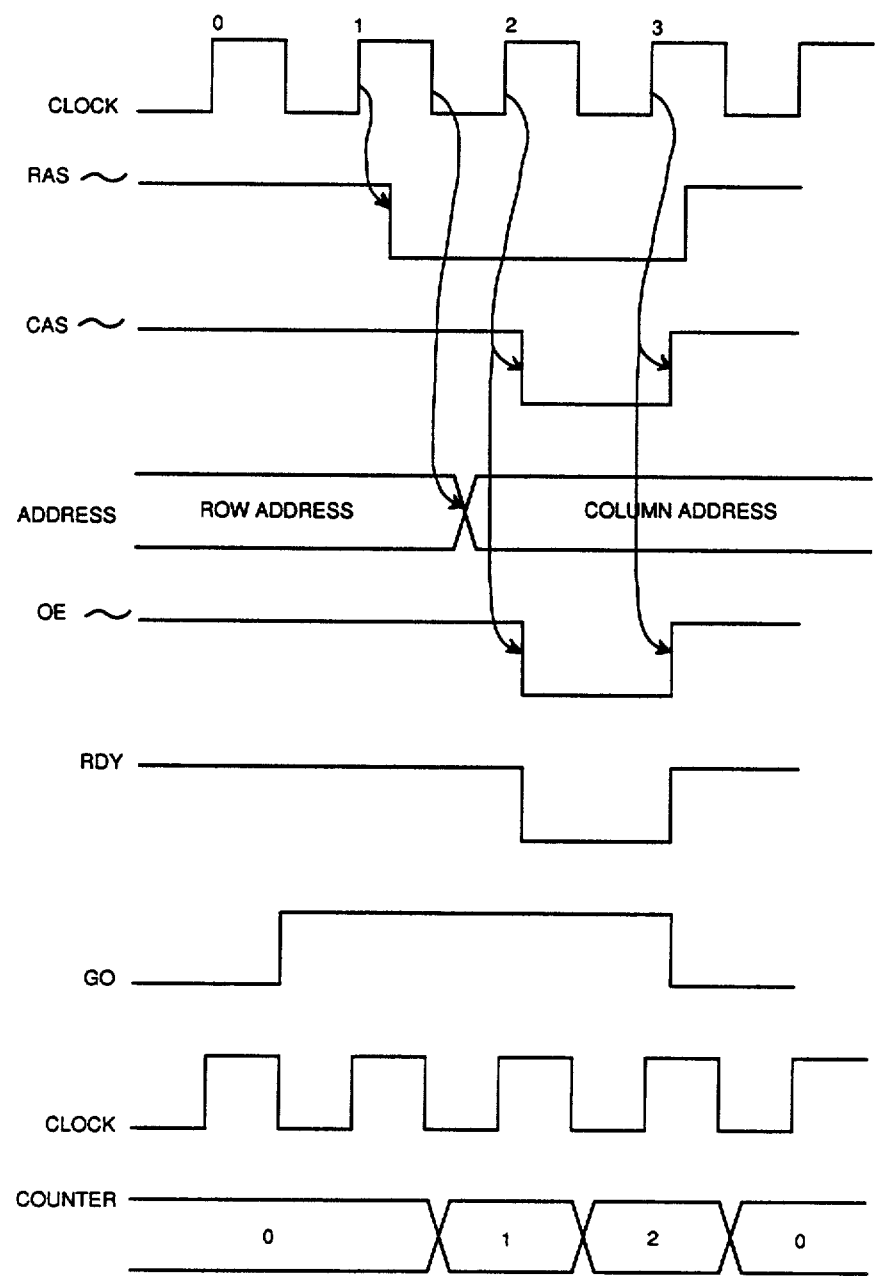
FIG. 3 illustrates the timing of various signals in a particular memory control system in accordance with the invention in which the length of the row address strobe and the column address strobe may be programmed.

FIG. 3 is another timing diagram illustrating the time which may be saved in a particular memory control system in which the length of two of these control signals, the row address strobe and the column address strobe, may be programmed to occur upon either the rising or falling edge of a clock pulse. In the diagram illustrated in FIG. 3, the clock is shown at the top followed by the row address strobe signal. It may be seen that the row address strobe signal begins at the rising edge of the second clock pulse during the interval in which the row address signal is available at the flip-flop 14 shown in FIG. 1. Since the control signals are presumed to be programmable to occur upon either the rising or falling edges of a clock pulse, the address changes from row address to column address on the falling edge of the second clock pulse rather than being required to wait for the rising edge of the third clock pulse. Consequently, at the rising edge of the third clock pulse, the column address strobe signal may occur to select the particular column address. At this same clock time, the output enable signal begins and continues until the rising edge of the fourth clock pulse at which point the row address strobe signal and the column address strobe signal both terminate.

Reviewing the intervals illustrated in FIG. 3, it is clear that the read operation illustrated therein takes but two clock cycles for its operation thereby conserving a clock cycle over the arrangement illustrated in FIG. 2 for accomplishing a read operation. Thus, a system implementing the timing illustrated in FIG. 3 may be made to operate essentially half again as fast as does the typical memory system.

Figure 4:
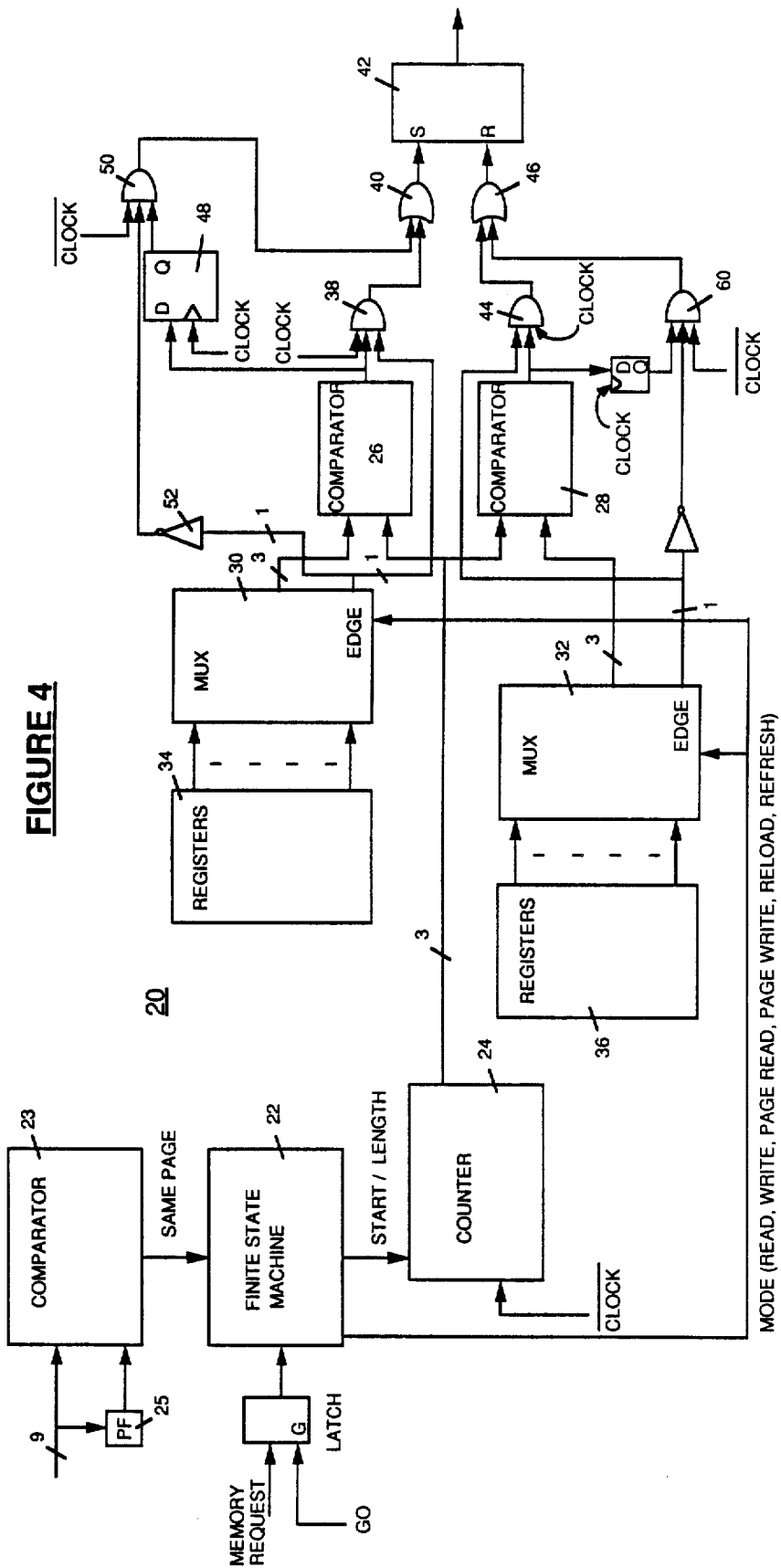
FIG. 4 illustrates an arrangement in accordance with the present invention by which programmable control signals may be provided for operating a memory matrix.

FIG. 4 illustrates an arrangement in accordance with the present invention by which programmable control signals of variable lengths may be provided for operating a memory matrix such as that shown in FIG. 1. The control system 20 illustrated in FIG. 4 includes a finite state machine 22 which receives a memory request from a processor controlling its operation. The finite state machine 22 provides output signals indicating the mode of operation, the starting time, and the number of counts at one count per clock cycle to be provided for the particular mode of operation. It should be noted that the system also includes a comparator 23 which receives the row address for the selected memory position and compares this address with the row address of the last signal which is stored in a flip-flop 25. This comparison determines whether the addresses are both in the same page so that page read or page write mode access may be performed as appropriate.

The signals indicating the number of counts and the starting time of the count are used to initiate operation of a counter 24. The counter 24 is driven by a clock signal (in the present case a clock bar signal or signal of opposite polarity to the system clock pulse) in the preferred embodiment. The output of the counter 24 is furnished to a pair of comparators 26 and 28 each of which also receives an output signal from either a multiplexor 30 and 32. The multiplexor 30 is furnished a number of inputs from a set of registers 34 while the multiplexor 32 receives a number of inputs from a set of registers 36. The registers 34 and 36 each store information indicative of a particular count upon which an operation is to occur and the edge upon which the particular action is to occur. Each register of the registers 34 in the preferred embodiment stores four bits of information for one mode of memory access, three bits indicating the count upon which a control pulse is to commence and one bit indicating the edge of the clock upon which the commencement occurs (rising or falling).

The multiplexor 30 is enabled by a signal from the state machine 22 indicating the mode of operation of the memory array (read, write, page read, page write, or some other operation). Based on that mode signal, the multiplexor 30 selects from the registers 34 the count during which the leading edge of the particular control signal is to occur and the particular edge of the clock signal upon which that control signal is to take place. The count furnished by the multiplexor 30 is compared to the output of the counter 24 at a comparator 26; and when the counts coincide, produces an output signal which is furnished to and AND gate 38. The AND gate 38 also receives the system clock pulse and the edge signal from the multiplexor 30; and, when these three coincide, produces an output which is transferred by an OR gate 40 to set a set/reset flip-flop 42 and begin the particular control pulse. The set/reset flip-flop 42 is of a type which, once it has been placed in a particular condition such as set by a signal on the input set line, will remain in the set condition until reset by a signal on the reset line no matter what signals appear during the interim on the set line. In like manner, once reset by a signal on the reset line, the flip-flop 42 will remain reset until a set signal appears on the set line no matter what signals appear on the reset line.

In FIG. 3, for example, the leading edge of the row address strobe signal for a read access occurs following the rising edge of the second clock cycle. At this instant, the counter 24 is producing an output signalling a zero count, the count in which the row address strobe begins in FIG. 3.

Like the registers 34, each of the registers 36 in the preferred embodiment stores four bits of information defining the count and the clock edge. These are used, however, for terminating a control signal in one mode of operation of the memory. The multiplexor 32 also receives the mode signals from the state machine 22 to cause the selection of the trailing edge of the particular control signal causing signals from the selected one of the registers 36 to be furnished to the comparator 28. For example, in FIG. 3 the row address strobe signal ends at the rising edge of the third clock signal when the counter has reached two, and this would occur in the comparator 28 when the counter signal provided by counter 24 and the count signal provided by multiplexor 32 are equal. The output of the comparator 28 is furnished to an AND gate 44 which ANDs the system clock signal and the edge signal from the multiplexor 32 to produce a reset signal via an OR gate 46 to the set/reset flip-flop 42 and terminate the particular control signal.

In order to operate the system 20 illustrated in FIG. 4 to initiate or terminate a particular control signal on the falling edge of the clock pulse, the system 20 includes circuitry including a flip-flop 48 which receives the output of the comparator 26 and is driven by the system clock signal to furnish an output to an AND gate 50. The AND gate 50 receives the edge indication signal through an inverter 52 from the multiplexor 32 and the clock bar signal (a signal of polarity opposite the system clock signal). When these three signals coincide, an output is provided to the OR gate 40 to set the set/reset flip-flop 42.

The coincidence of the signals providing for timing based on the trailing edge of the clock pulse may be best illustrated by the read operation shown in FIG. 3 in which the read signal is initiated by the falling edge of the second clock pulse.

In operation, the system 20 receives a memory request at the finite state machine 22. The machine 22 provides a mode output signal to the multiplexors 30 and 32 and starts the operation of the counter by means of a start signal and length of count signal. The multiplexor 30 selects the appropriate register 34 to provide the count start signal and an edge for the start of the control signal for the particular mode. The comparator 26 compares the count and the count start signal furnished by the multiplexor 30 and produces an enabling output when they coincide. The enabling signal is furnished to the AND gates 38 and 50 where it is ANDed with the system clock signal and the edge signal and with the clock bar signal and the inverted edge signal, respectively. The particular edge signal selects the appropriate AND gate 38 or 50 to produce an output to the OR gate 40 for setting the flip-flop 42 and starting the control signal.

In like manner, the multiplexor 32 selects the appropriate register 36 to provide the count start signal and an edge signal for the end of the control signal for the particular mode. The comparator 28 compares the count and the count end signal furnished by the multiplexor 32 and produces an enabling output when they coincide. The enabling signal is furnished to the AND gates 44 and 54 where it is ANDed with the system clock signal and the edge signal and with the clock bar and the inverted edge signal, respectively. The particular edge signal selects the appropriate AND gate 44 or 60 to produce an output to the OR gate 46 for resetting the flip-flop 42 and ending the control signal. In this manner the starting and ending edges and the intervals of control signals such as the row address strobe, the column address strobe, the output enable, write enable, and address multiplexor control signals may be precisely programmed to enhance the speed of operation of the particular computer system.

Although only a few examples have been given to illustrate the operation of the circuit of the invention, it will be obvious that control signals may be selectively varied depending on the particular mode of operation desired for the circuitry as well as the particular switching times of which the memory elements are capable. Consequently, the circuitry illustrated in FIG. 4 is capable of providing much faster operation times for memory switching than are prior art arrangements.

Although the invention has been described with reference to particular arrangements and computer systems, it will be apparent to those skilled in the art that the details of those arrangements and systems are used for illustrative purposes and should not be take as limitations of the invention. It is, thus, to be contemplated that many changes and modifications may be made by those of ordinary skill in the art without departing from the scope and spirit of the invention.

What is claimed is:

1. A circuit for providing control signals of selectable lengths capable of being driven off of either the rising or falling edge of a clock pulse, the circuit comprising means for providing signals indicating a mode of operation for access to a matrix of memory elements, means responsive to the signals provided by the means for providing signals indicating a mode of operation for providing signals indicating a clock period during which a control signal is to commence and the edge of the clock signal at which such signal is to commence, and means responsive to the signals provided by the means for providing signals indicating a mode of operation for providing signals indicating a clock period during which a control signal is to terminate and the edge of the clock signal at which such signal is to terminate.

2. A circuit as claimed in claim 1 for providing control signals of selectable lengths capable of being driven off of either the rising or falling edge of a clock pulse in which the means responsive to the signals provided by the means for providing signals indicating a mode of operation for providing signals indicating a clock period during which a control signal is to commence and the edge of the clock signal at which such signal is to commence comprises a means for storing a plurality of signals indicating clock periods and clock edges for a plurality of modes of operation, means for selecting from the plurality of signals depending on the mode of operation to provide signals indicating a clock period and a clock edge for each mode, means for comparing a signal indicating a clock period for a mode with actual clock periods, and means for comparing a signal indicating a clock edge for a mode with actual clock edges.

3. A circuit as claimed in calim 2 for providing control signals of selectable lengths capable of being driven off of either the rising or falling edge of a clock pulse in which the means for comparing a signal indicating a clock period for a mode with actual clock periods comprises a counter for furnishing signals indicating clock periods, a comparator circuit for comparing signals furnished by the counter with signals furnished by the means for selecting from the plurality of signals depending on the mode of operation to provide signals indicating a clock period, and means responsive to the comparator circuit for providing a signal indicating that the clock period is correct.

4. A circuit as claimed in claim 2 for providing control signals of selectable lengths capable of being driven off of either the rising or falling edge of a clock pulse in which the means for comparing a signal indicating a clock edge for a mode with actual clock edges comprises means for providing an output signal when a first clock edge and a first signal indicating a clock edge provided by the means for selecting from the plurality of signals depending on the mode of operation to provide signals indicating a clock period and a clock edge for each mode coincide; and means for providing an output signal when a second clock edge and a second signal indicating a clock edge provided by the means for selecting from the plurality of signals depending on the mode of operation to provide signals indicating a clock period and a clock edge for each mode coincide.

5. A circuit as claimed in claim 1 for providing control signals of selectable lengths capable of being driven off of either the rising or falling edge of a clock pulse in which the means responsive to the signals provided by the means for providing signals indicating a mode of operation for providing signals indicating a clock period during which a control signal is to terminate and the edge of the clock signal at which such signal is to terminate comprises means for storing a plurality of signals indicating clock periods and clock edges for a plurality of modes of operation, means for selecting from the plurality of signals depending on the mode of operation to provide signals indicating a clock period and a clock edge for each mode, means for comparing a signal indicating a clock period for a mode with actual clock period, and means for comparing a signal indicating a clock edge for a mode with actual clock edges.

6. A circuit as claimed in claim 5 for providing control signals of selectable lengths capable of being driven off of either the rising or falling edge of a clock pulse in which the means for comparing a signal indicating a clock period for a mode with actual clock periods comprises a counter for furnishing signals indicating clock periods, a comparator circuit for comparing signals furnished by the counter with signals furnished by the means for selecting from the plurality of signals depending on the mode of operation to provide signals indicating a clock period, and means responsive to the comparator circuit for providing a signal indicating that the clock period is correct.

7. A circuit as claimed in claim 5 for providing control signals of selectable lengths capable of being driven off of either the rising or falling edge of a clock pulse in which the means for comparing a signal indicating a clock edge for a mode with actual clock edges comprises means for providing an output signal when a first clock edge and a first signal indicating a clock edge provided by the means for selecting from the plurality of signals depending on the mode of operation to provide signals indicating a clock period and a clock edge for each mode coincide; and means for providing an output signal when a second clock edge and a second signal indicating a clock edge provided by the means for selecting from the plurality of signals depending on the mode of operation to provide signals indicating a clock period and a clock edge for each mode coincide.

8. A circuit as claimed in claim 1 for providing control signals of selectable lengths capable of being driven off of either the rising or falling edge of a clock pulse in which the means responsive to the signals provided by the means for providing signals indicating a mode of operation for providing signals indicating a clock period during which a control signal is to commence and the edge of the clock signal at which such signal is to commence comprises first means for storing a plurality of signals indicating clock periods and clock edges for a plurality of modes of operation, first means for selecting from the plurality of signals depending on the mode of operation to provide signals indicating a clock period and a clock edge for each mode, first means for comparing a signal indicating a clock period for a mode with actual clock periods, and first means for comparing a signal indicating a clock edge for a mode with actual clock edges; and in which the means responsive to the signals provided by the means for providing signals indicating a mode of operation for providing signals indicating a clock period during which a control signal is to terminate and the edge of the clock signal at which such signal is to terminate comprises second means for storing a plurality of signals indicating clock periods and clock edges for a plurality of modes of operation, second means for selecting from the plurality of signals depending on the mode of operation to provide signals indicating a clock period and a clock edge for each mode, second means for comparing a signal indicating a clock period for a mode with actual clock periods, and second means for comparing a signal indicating a clock edge for a mode with actual clock edges.

9. A circuit as claimed in claim 8 for providing control signals of selectable lengths capable of being driven off of either the rising or falling edge of a clock pulse in which the first means for comparing a signal indicating a clock period for a mode with actual clock periods comprises a counter for furnishing signals indicating clock periods, a first comparator circuit for comparing signals furnished by the counter with signals furnished by the first means for selecting from the plurality of signals depending on the mode of operation to provide signals indicating a clock period, and first means responsive to the comparator circuit for providing a signal indicating that the clock period is correct; and in which the second means for comparing a signal indicating a clock period for a mode with actual clock periods comprises the counter for furnishing signals indicating clock periods, a second comparator circuit for comparing signals furnished by the counter with signals furnished by the second means for selecting from the plurality of signals depending on the mode of operation to provide signals indicating a clock period, and second means responsive to the the comparator circuit for providing a signal indicating that the clock period is correct.

10. A circuit as claimed in claim 8 for providing control signals of selectable lengths capable of being driven off of either the rising or falling edge of a clock pulse in which each of the first and second means for comparing a signal indicating a clock edge for a mode with actual clock edges comprises means for providing an output signal when a first clock edge and a first signal indicating a clock edge provided by the means for selecting from the plurality of signals depending on the mode of operation to provide signals indicating a clock period and a clock edge for each mode coincide; and means for providing an output signal when a second clock edge and a second signal indicating a clock edge provided by the means for selecting from the plurality of signals depending on the mode of operation to provide signals indicating a clock period and a clock edge for each mode coincide.

11. A circuit for providing control signals of selectable lengths capable of being driven off of either the rising or falling edge of a clock pulse comprising means for providing signals indicating a mode of operation for access to a matrix of memory elements, a first plurality of registers for storing signals indicating a clock period during which a control signal is to commence and the edge of the clock signal at which such signal is to commence, a first multiplexor responsive to the signals provided by the means for providing signals indicating a mode of operation for providing signals from the first plurality registers indicating a clock period during which a control signal is to commence and the edge of the clock signal at which such signal is to commence, a first comparator for comparing a signal indicating a clock period for a mode with actual clock periods, and first means for comparing a signal indicating a clock edge for a mode with an actual clock edge; and a second plurality of registers for storing signals indicating a clock period during which a control signal is to terminate and the edge of the clock signal at which such signal is to terminate, a second multiplexor responsive to the signals provided by the means for providing signals indicating a mode of operation for providing signals from the second registers indicating a clock period during which a control signal is to terminate and the edge of the clock signal at which such signal is to terminate, a second comparator for comparing a signal indicating a clock period for a mode with actual clock periods, and second means for comparing a signal indicating a clock edge for a mode with an actual clock edge.

12. A circuit as claimed in claim 11 for providing control signals of selectable lengths capable of being driven off of either the rising or falling edge of a clock pulse comprising in which the first and second means for comparing a signal indicating a clock edge for a mode with an actual clock edge each comprises means for providing an output signal when a first clock edge and a first signal indicating a clock edge provided by the multiplexor for selecting from the plurality of signals depending on the mode of operation to provide signals indicating a clock period and a clock edge for each mode coincide; and means for providing an output signal when a second clock edge and a second signal indicating a clock edge provided by the means for selecting from the plurality of signals depending on the mode of operation to provide signals indicating a clock period and a clock edge for each mode coincide.

* * * * *